US012610662B2

(12) United States Patent
Nishimura et al.

(10) Patent No.: US 12,610,662 B2
(45) Date of Patent: Apr. 21, 2026

(54) LAMINATED STRUCTURE

(71) Applicant: Japan Display Inc., Tokyo (JP)

(72) Inventors: Masumi Nishimura, Tokyo (JP); Shinichiro Oka, Tokyo (JP); Hiroumi Kinjo, Tokyo (JP); Hayata Aoki, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 434 days.

(21) Appl. No.: 18/469,731

(22) Filed: Sep. 19, 2023

(65) Prior Publication Data

US 2024/0030384 A1      Jan. 25, 2024

Related U.S. Application Data

(63) Continuation of application No. PCT/JP2022/014563, filed on Mar. 25, 2022.

(30) Foreign Application Priority Data

Mar. 31, 2021     (JP) ................................. 2021-059368

(51) Int. Cl.
| | |
|---|---|
| *H10H 20/825* | (2025.01) |
| *C23C 14/06* | (2006.01) |
| *H10H 20/82* | (2025.01) |

(52) U.S. Cl.
CPC ..... *H10H 20/8252* (2025.01); *C23C 14/0641* (2013.01); *H10H 20/82* (2025.01)

(58) Field of Classification Search
CPC .............. C23C 14/024; C23C 14/0641; H10H 20/8252
See application file for complete search history.

(56) References Cited

U.S. PATENT DOCUMENTS

| | | | |
|---|---|---|---|
| 6,146,916 A | 11/2000 | Nanishi et al. | |
| 8,791,474 B1 | 7/2014 | Bibl et al. | |
| 11,121,522 B1* | 9/2021 | Raring ................. | H01S 5/0203 |
| 2006/0257626 A1 | 11/2006 | Schlesser et al. | |

(Continued)

FOREIGN PATENT DOCUMENTS

| | | |
|---|---|---|
| JP | S5710280 A | 1/1982 |
| JP | H11243229 A | 9/1999 |

(Continued)

OTHER PUBLICATIONS

Office Action issued on Sep. 3, 2024, in corresponding Japanase Application No. 2023-511189, 9 pages.

(Continued)

*Primary Examiner* — Steven M Page
(74) *Attorney, Agent, or Firm* — Maier & Maier, PLLC

(57) ABSTRACT

A laminated structure includes a substrate, and a gallium nitride film on the substrate. Further, a laminated structure includes a substrate, an alignment layer having a c-axis orientation or a (111) orientation of a face-centered cubic structure, over the substrate, and a gallium nitride film on the alignment film. Furthermore, a laminated structure includes a substrate, a protective layer on the substrate, an alignment layer having a c-axis orientation or a (111) orientation of a face-centered cubic structure, over the protective layer, and a gallium nitride film on the alignment film. A surface arithmetic mean roughness (Ra) of a surface of the substrate is less than 0.33 nm.

19 Claims, 12 Drawing Sheets

10

200

100

(56)           References Cited

U.S. PATENT DOCUMENTS

| | | | |
|---|---|---|---|
| 2018/0278231 A1* | 9/2018 | Hurwitz | ................ H03H 9/588 |
| 2020/0075664 A1 | 3/2020 | Azize et al. | |
| 2023/0017020 A1* | 1/2023 | Chen | .................... H10D 64/689 |

FOREIGN PATENT DOCUMENTS

| | | | |
|---|---|---|---|
| JP | 2000124140 A | 4/2000 |
| JP | 2002255694 A | 9/2002 |
| JP | 2006316308 A | 11/2006 |
| JP | 2008540315 A | 11/2008 |
| WO | 2009072631 A1 | 6/2009 |

OTHER PUBLICATIONS

International Search Report mailed on Jun. 28, 2022, in corresponding International Application No. PCT/JP2022/014563, 7 pages.

\* cited by examiner

10

200

100

20

200

300

100

30

200

300

400

100

30D

200

300D-2

300D-1

400

100

LAMINATED STRUCTURE

CROSS-REFERENCE TO RELATED APPLICATIONS

This application is a Continuation of International Patent Application No. PCT/JP2022/014563, filed on Mar. 25, 2022, which claims the benefit of priority to Japanese Patent Application No. 2021-059368, filed on Mar. 31, 2021, the entire contents of which are incorporated herein by reference.

FIELD

One embodiment of the present invention relates to a laminated structure including a gallium nitride film formed over a substrate.

BACKGROUND

Gallium nitride (GaN) is characterized as a direct bandgap semiconductor with a large bandgap. This feature of gallium nitride is utilized, and a light emitting diode (LED) using gallium nitride has already been in practical use. Gallium nitride also has the characteristics of high electron saturation mobility and high breakdown voltage. In recent years, the characteristics of gallium nitride are utilized, and a transistor for a high-frequency power device has been developed. A gallium nitride film for a light emitting diode or a transistor is generally formed on a sapphire substrate at a high temperature of 800 degrees to 1000 degrees using MOCVD (Metal Organic Chemical Vapor Deposition) or HVPE (Hydride Vapor Phase Epitaxy).

In recent years, the development of a so-called micro LED display device or a mini-LED display device in which minute micro LEDs are mounted in pixels on a circuit substrate is proceeding as a next-generation display device. The micro LED display device or the mini LED display device has high efficiency, high brightness and high reliability. Such a micro LED display device or a mini-LED display device is manufactured by transferring a LED chip to a backplane on which a transistor using an oxide semiconductor or low-temperature polysilicon is formed (for example, see U.S. Pat. No. 8,791,474). Further, a method for forming a transistor and a light emitting diode including gallium nitride on the same substrate has been developed (for example, see U.S. Patent Application Publication No. 2020/0075664).

SUMMARY

A laminated structure according to an embodiment of the present invention includes a substrate, and a gallium nitride film on the substrate. A surface arithmetic mean roughness (Ra) of a surface of the substrate is less than 0.33 nm.

A laminated structure according to an embodiment of the present invention includes a substrate, an alignment layer having a c-axis orientation or a (111) orientation of a face-centered cubic structure, over the substrate, and a gallium nitride film on the alignment film. A surface arithmetic mean roughness (Ra) of a surface of the substrate is less than 0.33 nm.

A laminated structure according to an embodiment of the present invention includes a substrate, a protective layer on the substrate, an alignment layer having a c-axis orientation or a (111) orientation of a face-centered cubic structure, over the protective layer, and a gallium nitride film on the alignment film. A surface arithmetic mean roughness (Ra) of a surface of the substrate is less than 0.33 nm.

DESCRIPTION OF EMBODIMENTS

Figure 1:
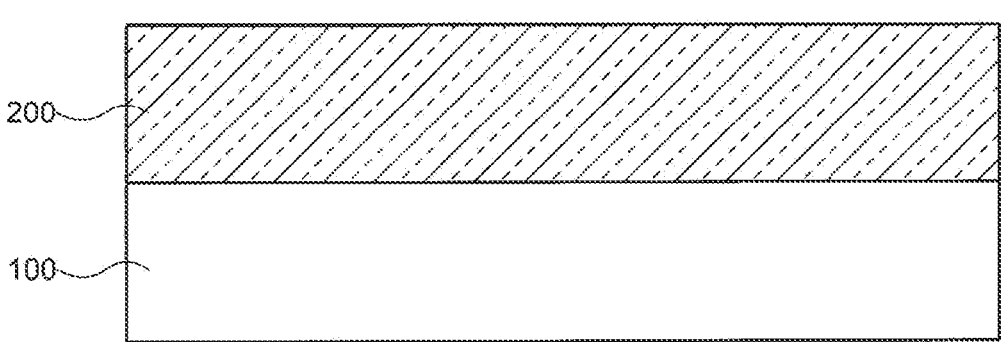
FIG. 1 is a schematic diagram showing a configuration of a laminated structure according to an embodiment of the present invention.

In general, a gallium nitride film is deposited on a sapphire substrate at a high temperature. Since a large-area substrate such as an amorphous glass substrate has low heat resistance, a gallium nitride film formed at a low temperature has a problem of low crystallinity. Further, there is another problem that it is difficult to provide a gallium nitride film using a large-area backplane.

In view of the above problems, one object of an embodiment of the present invention is to provide a laminated structure in which a gallium nitride film with high crystallinity is formed over a substrate that can have a large area.

Hereinafter, each of the embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a structure over a substrate, one surface of the structure in the direction facing the substrate is the bottom surface of the structure and the other surface is the upper surface of the structure. In addition, the expression of a structure over a substrate only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers overlap in a plan view.

In the specification, terms such as "first", "second", or "third" attached to each configuration are convenient terms used to distinguish each configuration, and have no further meaning unless otherwise explained.

In the specification and the drawings, the same reference numerals may be used when multiple configurations are identical or similar in general, and reference numerals with a lower or upper case letter of the alphabet may be used when the multiple configurations are distinguished. Further, reference numerals with a hyphen and a natural number may be used when multiple portions of one configuration are distinguished.

The following embodiments can be combined with each other as long as there is no technical contradiction.

First Embodiment

FIG. 1 is a schematic diagram showing a configuration of a laminated structure according to an embodiment of the present invention. The laminated structure 10 includes a substrate 100 and a gallium nitride film 200. The gallium nitride film 200 is formed on the substrate 100 using sputtering.

The substrate 100 is a support substrate for the gallium nitride film 200. Since the gallium nitride film 200 of the laminated structure 10 is formed by sputtering, the substrate 100 may have heat resistance of about 600 degrees, for example. Therefore, for example, an amorphous glass substrate can be used as the substrate 100. Alternatively, a resin substrate such as a polyimide substrate, an acrylic substrate, a siloxane substrate, or a fluororesin substrate can be used as the substrate 100. In addition, the amorphous glass substrate or the resin substrate is a substrate that can have a large area. A polycrystalline substrate can also be used as the substrate 100. Since the polycrystalline substrate is larger than the sapphire substrate used in normal film deposition of gallium nitride films, the polycrystalline substrate can be used as a backplane in the same manner as the glass substrate or the resin substrate.

Crystal growth of the gallium nitride film 200 on the substrate 100 such as an amorphous glass is affected by the surface state of the substrate 100. In particular, unevenness on the surface of the substrate 100 randomly cause the generation of crystal nuclei. As a result, since crystal growth of gallium nitride occurs in random directions, adjacent crystals interfere with each other and crystal growth is inhibited. Therefore, it is preferable that the substrate 100 has a smooth surface with little unevenness. For example, the arithmetic mean roughness (Ra) of the surface of substrate 100 is preferably less than 0.33 nm. Further, the root mean square roughness (Rq) of the surface of the substrate 100 is preferably less than 0.39 nm. When the surface roughness of the substrate 100 satisfies the above conditions, the crystallinity of the gallium nitride film 200 can be improved even when the substrate 100 is amorphous and is a glass substrate. In other words, the gallium nitride film 200 having a c-axis orientation (an orientation in which the surface has a (0001) plane) can be formed on the substrate 100.

Here, the deposition of the gallium nitride film 200 using sputtering is described.

The substrate 100 is placed to face the gallium nitride target in a vacuum chamber. It is preferable that the composition ratio of gallium nitride in the gallium nitride target is greater than or equal to 0.7 and less than or equal to 2 of gallium to nitrogen. Nitrogen can also be supplied to the vacuum chamber as a gas other than the sputtering gas (such as argon or krypton). In that case, it is preferable that the composition ratio of gallium nitride in the gallium nitride target is more gallium than nitrogen. For example, nitrogen can be supplied using a nitrogen radical source. The sputtering power supply source may be either a DC power supply source, an RF power supply source, or a pulsed DC power supply source.

The substrate 100 in the vacuum chamber may be heated. For example, the substrate 100 can be heated at a temperature of greater than or equal to 400 degrees and less than 600 degrees. This substrate temperature can be applied to an amorphous glass substrate having low heat resistance. Further, this substrate temperature is lower than the deposition temperature in MOCVD or HYPE.

After the vacuum chamber is sufficiently evacuated, the sputtering gas is supplied to the vacuum chamber. Further, a voltage is applied between the substrate 100 and the gallium nitride target at a predetermined pressure to generate plasma and the gallium nitride film is deposited. Since the gallium nitride film 200 is formed on the substrate 100 which has a controlled surface roughness, the gallium nitride film 200 has a c-axis orientation.

The laminated structure 10 according to this embodiment includes the gallium nitride film 200 with high crystallinity and the c-axis orientation. Further, the laminated structure 10 includes the substrate 100 that can have a large area. Therefore, by using the laminated structure 10, it is possible to increase the productivity of LEDs containing gallium nitride, or to manufacture a backplane on which transistors containing gallium nitride are formed.

Second Embodiment

Figure 2:
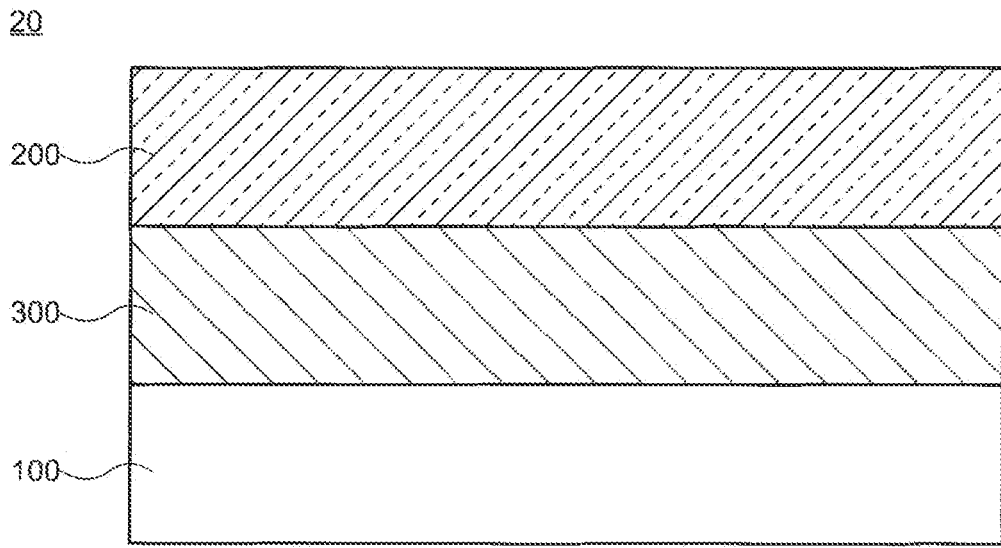
FIG. 2 is a schematic diagram showing a configuration of a laminated structure according to an embodiment of the present invention.

FIG. 2 is a schematic diagram showing a configuration of a laminated structure according to an embodiment of the present invention. The laminated structure 20 includes the substrate 100, an alignment layer 300 and the gallium nitride film 200. The alignment layer 300 is provided on the substrate 100. Further, the gallium nitride film 200 is formed on the alignment layer 300 using sputtering. In the following description, when the configuration of the laminated structure 20 is the same as the configuration of the laminated structure 10, the description of the configuration of the laminated structure may be omitted.

The alignment layer 300 can improve the crystallinity of the gallium nitride film 200. That is, the alignment layer 300 can further improve the c-axis orientation of the gallium nitride film 200. Although the gallium nitride film 200 having a hexagonal close-packed structure is oriented along the c-axis so as to minimize surface energy even on the smooth substrate 100, the c-axis orientation of the gallium nitride film 200 can be controlled by providing the alignment layer 300 on the substrate. Specifically, the c-axis orientation of the gallium nitride film 200 is controlled by the type of material of the alignment layer 300. The alignment layer 300 can use a material having a hexagonal close-packed structure, a face-centered cubic structure, or a structure equivalent thereto. Here, the structure equivalent to the hexagonal close-packed structure or the face-centered cubic structure includes a crystal structure in which the c-axis is not 90 degrees with respect to the a-axis and the b-axis. In the material having the hexagonal close-packed structure or the structure equivalent thereto, the alignment layer 300 can have an orientation in the (0001) direction, that is, in the c-axis direction with respect to the substrate 100 (hereinafter, it is referred to as the (0001) orientation of the hexagonal close-packed structure or the c-axis orientation.). In the material having the face-centered cubic structure or the structure equivalent thereto, the alignment layer 300 can have an orientation in the (111) direction with respect to the substrate 100 (hereinafter, it is referred to as the (111) orientation of the face-centered cubic structure). When the alignment layer 300 has the c-axis orientation or the (111) orientation of the face-centered cubic structure, the gallium nitride film 200 also easily has the c-axis orientation. For example, titanium (Ti), titanium nitride (TiN$_x$), titanium oxide (TiO$_x$), graphene, zinc oxide (ZnO), magnesium diboride (MgB$_2$), aluminum (Al), aluminum nitride (AlN), aluminum oxide (Al$_2$O$_3$), silver (Ag), calcium (Ca), nickel (Ni), copper (Cu), strontium (Sr), rhodium (Rh), palladium (Pd), cerium (Ce), ytterbium (Yb), iridium (Ir), platinum (Pt), gold (Au), lead (Pb), actinium (Ac), thorium (Th), lithium niobate (LiNbO), BiLaTiO, SrFeO, SrFeO, BiFeO, BaFeO, ZnFeO, PMnN-PZT, or biogenic apatite (BAp) can be used for the alignment layer 300. In particular, it is preferable that titanium, graphene, zinc oxide, aluminum nitride, or aluminum oxide is used for the alignment layer 300. Further, the film thickness of the alignment layer 300 is, for example, greater than or equal to 50 nm. In addition, the deposition of the alignment layer 300 is not limited to sputtering. The alignment layer 300 can be deposited using any method (apparatus) such as CVD.

As described above, the crystallinity of the gallium nitride film 200 is affected by the surface state of the surface to be deposited. That is, the gallium nitride film 200 is affected by the surface state of the alignment layer 300 in the laminated structure 20. Therefore, the alignment layer 300 preferably has a smooth surface with little unevenness. For example, the surface arithmetic mean roughness (Ra) of the alignment layer 300 is preferably less than 2.3 nm. Further, the root mean square roughness (Rq) of the surface of the alignment layer 300 is preferably less than 2.9 nm. When the surface roughness of the alignment layer 300 is under the above conditions, the gallium nitride film 200 having c-axis orientation can be formed.

In addition, since the alignment layer 300 is formed on the substrate 100, the crystallinity of the alignment layer 300 is affected by the surface roughness of the substrate 100 to some extent. Therefore, also in the laminated structure 20, the substrate 100 preferably has a smooth surface with little unevenness. For example, the arithmetic mean roughness (Ra) of the surface of substrate 100 is preferably less than 0.33 nm. Further, the root mean square roughness (Rq) of the surface of the substrate 100 is preferably less than 0.39 nm.

The laminated structure 20 according to this embodiment includes the gallium nitride film 200 with high crystallinity and the c-axis orientation. Further, the laminated structure 20 includes the substrate 100 that can have a large area. Therefore, by using the laminated structure 20, it is possible to increase the productivity of LEDs containing gallium nitride, or to manufacture a backplane on which transistors containing gallium nitride are formed.

Third Embodiment

Figure 3:
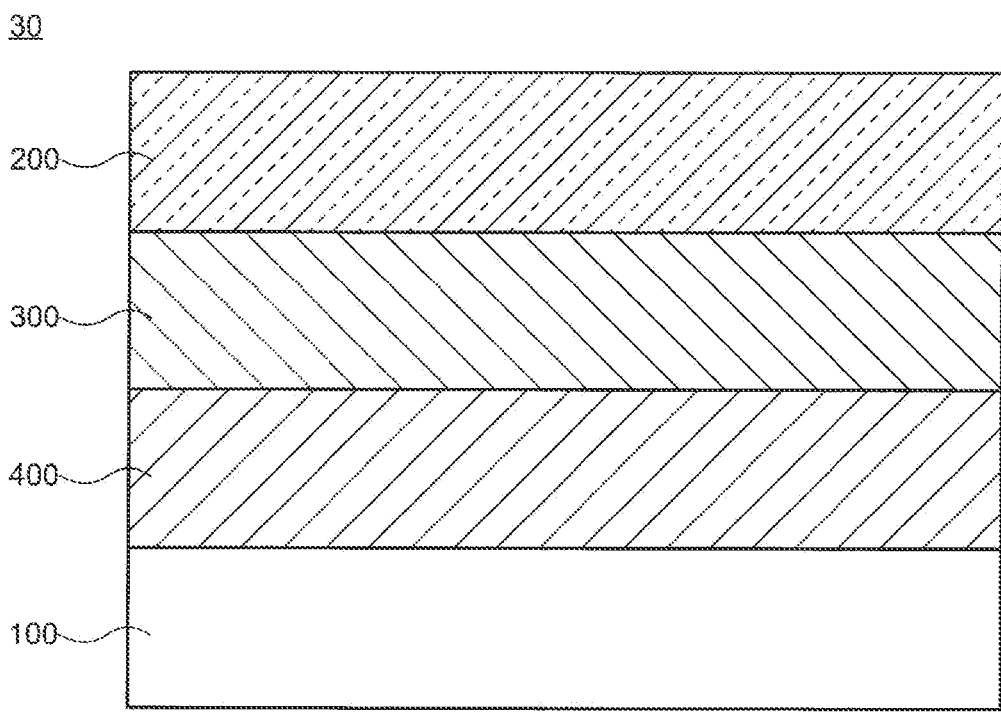
FIG. 3 is a schematic diagram showing a configuration of a laminated structure according to an embodiment of the present invention.

FIG. 3 is a schematic diagram showing a configuration of a laminated structure according to an embodiment of the present invention. The laminated structure 30 includes the substrate 100, a protective layer 400, the alignment layer 300 and the gallium nitride film 200. The protective layer 400 is provided on the substrate 100. The alignment layer 300 is provided on the protective layer 400. Further, the gallium nitride film 200 is formed on the alignment layer 300 using sputtering. In the following description, when the configuration of the laminated structure 30 is the same as the configuration of the laminated structure 10 or the laminated structure 20, the description of the configuration of the laminated structure may be omitted.

The protective layer 400 can prevent the diffusion of impurities from the substrate 100. Therefore, since the alignment layer 300 formed on the protective layer 400 has few impurities, the crystallinity is improved. For example, silicon oxide (SiO$_x$) or silicon nitride (SiN$_x$) can be used for the protective layer 400. In addition, the protective layer 400 may be a single film or a laminated film. For example, when the substrate 100 is an amorphous glass substrate, a laminated film of silicon nitride and silicon oxide (SiO$_x$/SiN$_x$) can be used. Further, when the substrate 100 is a resin substrate, a laminated film in which silicon nitride is sandwiched between silicon oxides (SiO$_x$/SiN$_x$/SiO$_x$) can be used.

Since the alignment layer 300 is formed on the protective layer 400 In the laminated structure 30, the crystallinity of the alignment layer 300 is affected by the surface roughness of the protective layer 400. Therefore, the protective layer 400 preferably has a smooth surface with little unevenness in the laminated structure 30. For example, the surface arithmetic mean roughness (Ra) of the protective layer 400 is preferably less than 0.51 nm. Further, the root mean square roughness (Rq) of the surface of the protective layer 400 is preferably less than 0.60 nm.

The laminated structure 30 according to this embodiment includes the gallium nitride film 200 with high crystallinity and the c-axis orientation. Further, the laminated structure 30 includes the substrate 100 that can have a large area. Therefore, by using the laminated structure 30, it is possible to increase the productivity of LEDs containing gallium nitride, or to manufacture a backplane on which transistors containing gallium nitride are formed.

In the following description, several modifications of the laminated structure 30 according to this embodiment are described.

<Modification 1>

Figure 4:
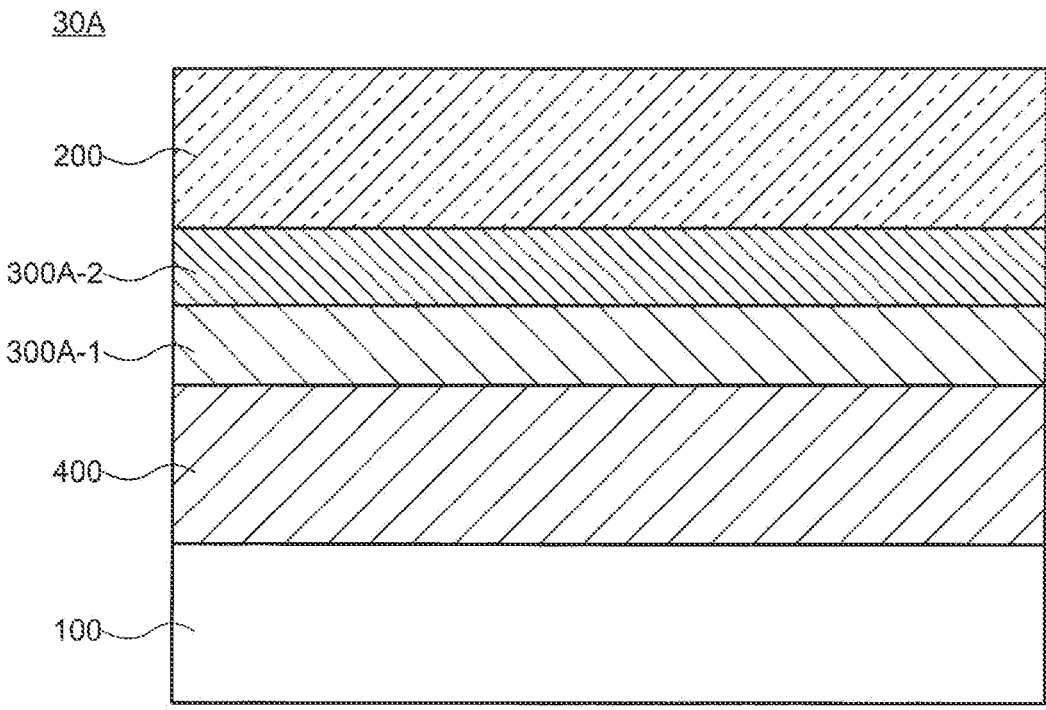
FIG. 4 is a schematic diagram showing a configuration of a laminated structure according to an embodiment of the present invention.

FIG. 4 is a schematic diagram showing a configuration of a laminated structure according to an embodiment of the present invention. The laminated structure 30A includes the substrate 100, the protective layer 400, a first alignment layer 300A-1, a second alignment layer 300A-2, and the gallium nitride film 200. The first alignment layer 300A-1 is provided on the protective layer 400. The second alignment layer 300A-2 is provided on the first alignment layer 300A-1. Further, the gallium nitride film 200 is provided on the second alignment layer 300A-2. That is, the second alignment layer 300A-2 is in contact with the gallium nitride film 200.

The first alignment layer 300A-1 and the second alignment layer 300A-2 are different in the type of alignment layer. For example, the first alignment layer 300A-1 and the second alignment layer 300A-2 are an insulator and a conductor, respectively. Further, the first alignment layer 300A-1 and the second alignment layer 300A-2 may be a conductor and an insulator, respectively. The materials of the alignment layer 300 described above can be used in combination for each of the first alignment layer 300A-1 and the second alignment layer 300A-2. The combination of materials for the first alignment layer 300A-1 and the second alignment layer 300A-2 may be appropriately selected in consideration of the device in which the laminated structure 30A is used. In addition, the second alignment layer 300A-2 with which the gallium nitride film 200 is in contact is preferably made of a material capable of preventing the diffusion of impurities from the first alignment layer 300A-1 to the gallium nitride film 200. Although the combination of materials of the first alignment layer 300A-1 and the second alignment layer 300A-2 is, for example, aluminum nitride and titanium, titanium nitride and titanium, or titanium oxide and titanium, the combination of materials of the first alignment layer 300A-1 and the second alignment layer 300A-2 is not limited thereto.

Each of the first alignment layer 300A-1 and the second alignment layer 300A-2 can also be a conductor, depending on the device in which the laminated structure 30A is used. Further, although the laminated structure 30A including two alignment layers is described in this modification, the laminated structure 30A may include three or more alignment layers.

<Modification 2>

Figure 5:
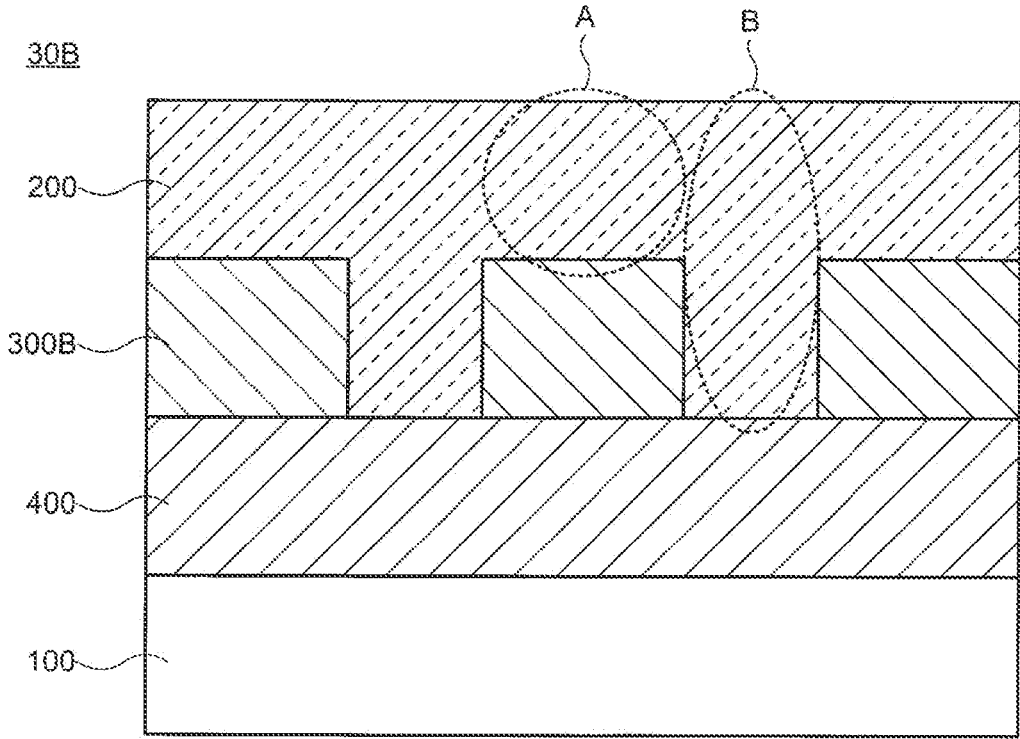
FIG. 5 is a schematic diagram showing a configuration of a laminated structure according to an embodiment of the present invention.

FIG. 5 is a schematic diagram showing a configuration of a laminated structure according to an embodiment of the present invention. The laminated structure 30B includes substrate 100, the protective layer 400, an alignment layer 300B, and the gallium nitride film 200. The alignment layer 300B is provided on the protective layer 400. Further, the gallium nitride film 200 is provided on the alignment layer 300B.

The alignment layer 300B is patterned in a predetermined pattern. The patterning of the alignment layer 300B can be performed using, for example, photolithography. As shown in FIG. 5, the alignment layer 300B is patterned such that a portion of the protective layer 400 is exposed. Therefore, the gallium nitride film 200 includes a region A in contact with the alignment layer 300B and a region B in contact with the protective layer 400B. In the region A, since the gallium nitride film 200 is formed on the alignment layer 300B, crystal growth can be performed while the c-axis orientation is controlled. On the other hand, in the region B, since the gallium nitride film 200 is formed on the protective layer 400, the c-axis orientation is not controlled as compared with the region A. That is, the laminated structure 30B includes the region A with high crystallinity and the region B with low crystallinity. Therefore, in the laminated structure 30B, it is possible to form the gallium nitride film 200 including regions with different crystallinity by patterning the alignment layer 300B.

When the laminated structure 30B can be used for a backplane, it is possible to provide the backplane in which the crystallinity of the gallium nitride film 200 is controlled.

<Modification 3>

Figure 6:
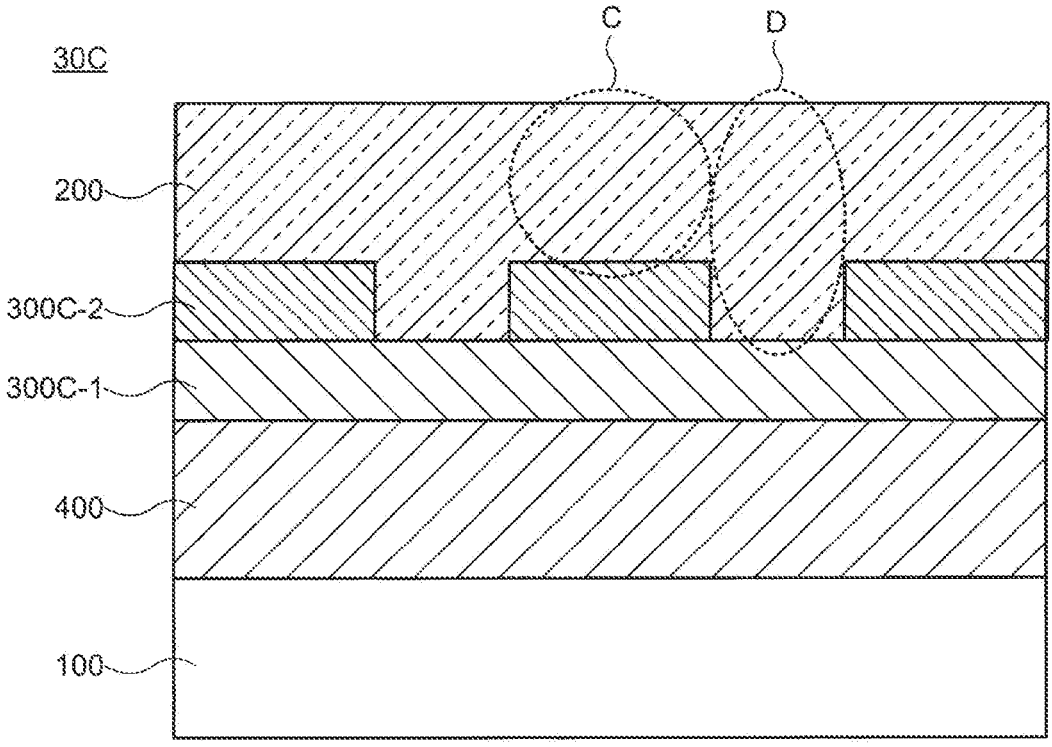
FIG. 6 is a schematic diagram showing a configuration of a laminated structure according to an embodiment of the present invention.

FIG. 6 is a schematic diagram showing a configuration of a laminated structure 30C according to an embodiment of the present invention. The laminated structure 30C includes the substrate 100, the protective layer 400, a first alignment layer 300C-1, a second alignment layer 300C-2, and the gallium nitride film 200. The first alignment layer 300 C-1 is provided on the protective layer 400. The second alignment layer 300C-2 is provided on the first alignment layer 300C-1. Further, the gallium nitride film 200 is provided on the second alignment layer 300C-2.

The second alignment layer 300C-2 is patterned in a predetermined pattern. The patterning of the second alignment layer 300C-2 can be performed, for example, using photolithography. As shown in FIG. 6, the second alignment layer 300C-2 is patterned to expose a portion of the first alignment layer 300C-1. Therefore, the gallium nitride film 200 includes a region C in contact with the first alignment layer 300C-1 and a region D in contact with the second alignment layer 300C-2. Since the surface states of the surfaces to be deposited on which the gallium nitride film 200 is formed differs between the region C and the region D, the degree of crystal growth of the gallium nitride film 200 (e.g., the ratio of the c-axis orientation (degree of orientation)) differs. Therefore, in the laminated structure 30C, it is possible to form the gallium nitride film 200 including regions with different crystallinity by patterning the second alignment layer 300C-2.

When the laminated structure 30C can be used for a backplane, it is possible to provide the backplane in which the crystallinity of the gallium nitride film 200 is controlled.

<Modification 4>

Figure 7:
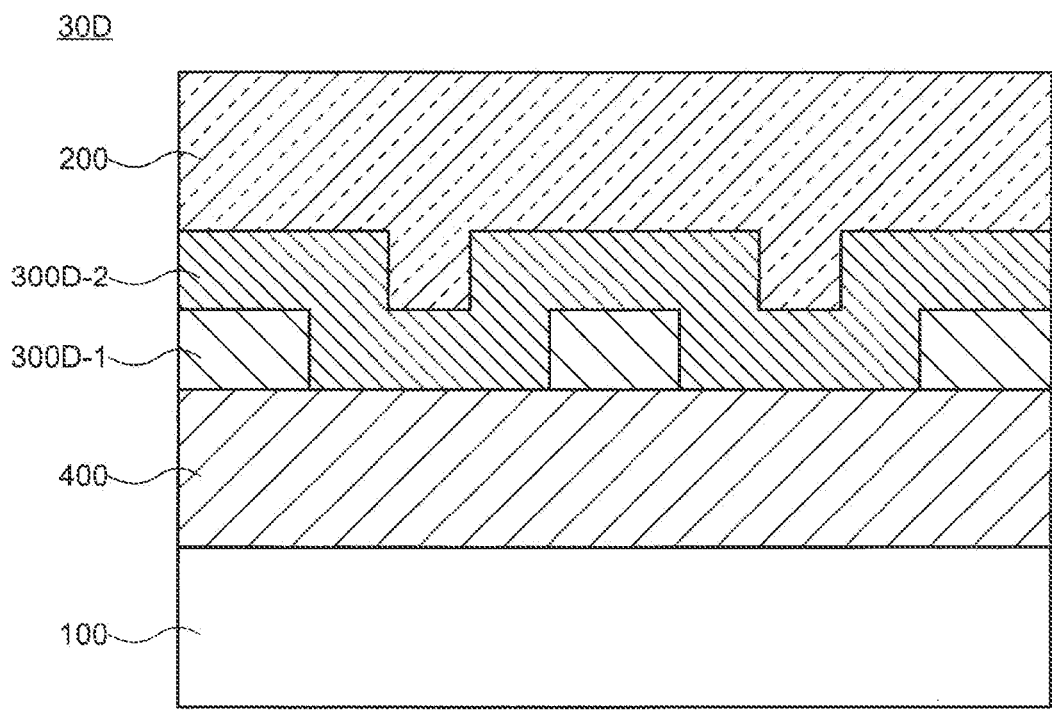
FIG. 7 is a schematic diagram showing a configuration of a laminated structure according to an embodiment of the present invention.

FIG. 7 is a schematic diagram showing a configuration of a laminated structure according to an embodiment of the present invention. The laminated structure 30D includes the substrate 100, the protective layer 400, a first alignment layer 300D-1, a second alignment layer 300D-2, and the gallium nitride film 200. The first alignment layer 300 D-1 is provided on the protective layer 400. The second alignment layer 300D-2 is provided on the first alignment layer 300D-1. Further, the gallium nitride film 200 is provided on the second alignment layer 300D-2.

The first alignment layer 300D-1 is patterned into a predetermined pattern. The patterning of the first alignment layer 300D-1 can be performed, for example, using photolithography. As shown in FIG. 7, the first alignment layer 300D-1 is patterned such that a portion of the protective layer 400 is exposed. However, the exposed part of the protective layer 400 is covered with the second alignment layer 300D-2 together with the first alignment layer 300D-1. That is, the second alignment layer 300D-2 includes a region formed on the first alignment layer 300D-1 and a region formed on the protective layer 400. Since each region has a different degree of crystal growth, the second alignment layer 300D-2 includes regions with different c-axis orientations or surface roughness. Further, the gallium nitride film 200 formed on such a second alignment layer 300D-2 also includes regions having different crystallinity corresponding to the respective regions of the second alignment layer 300D-2. Therefore, in the laminated structure 30D, it is possible to form the gallium nitride film 200 including regions with different crystallinity by patterning the first alignment layer 300D-1.

When the laminated structure 30D can be used for a backplane, it is possible to provide the backplane in which the crystallinity of the gallium nitride film 200 is controlled. Further, by using the uneven patterns of the first alignment layer 300D-1 and the second alignment layer 300D-2 as shown in FIG. 7, it is possible to control the light from the light emitting element and improve the light extraction efficiency.

Fourth Embodiment

Figure 8:
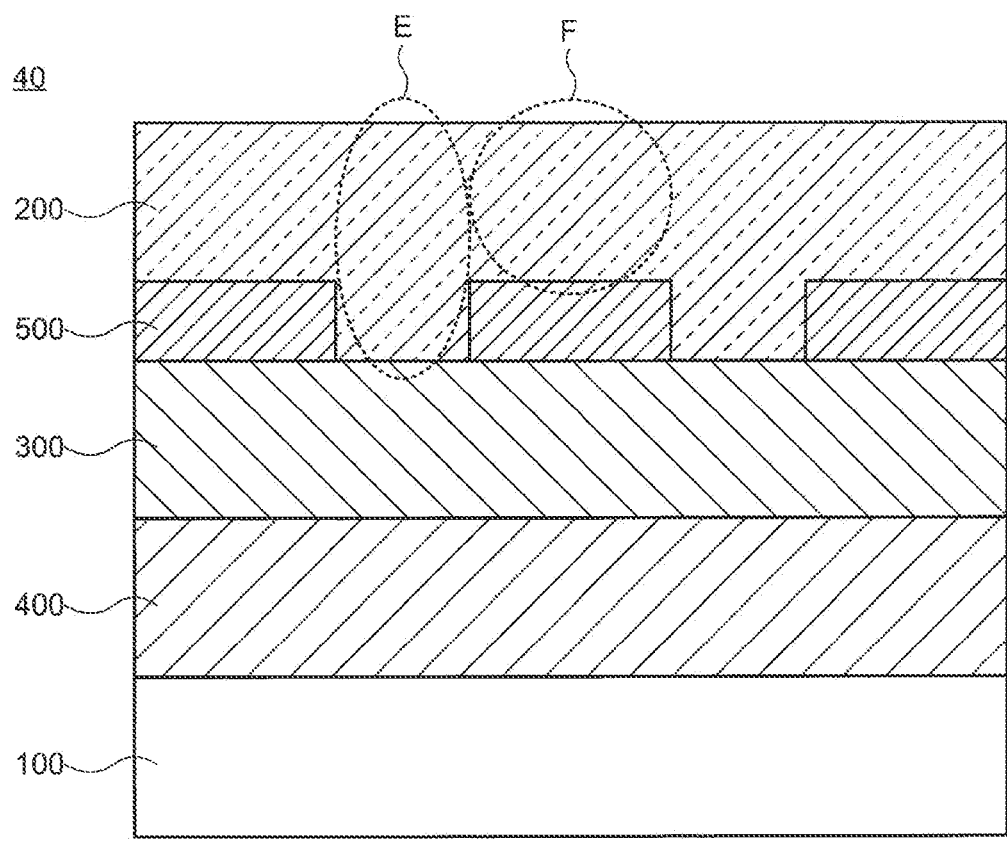
FIG. 8 is a schematic diagram showing a configuration of a laminated structure according to an embodiment of the present invention.

FIG. 8 is a schematic diagram showing a configuration of a laminated structure according to an embodiment of the present invention. The laminated structure 40 includes the substrate 100, the protective layer 400, the alignment layer 300, a non-alignment layer 500, and the gallium nitride film 200. The alignment layer 300 is provided on the protective layer 400. The non-alignment layer 500 is provided on the alignment layer 300. Further, the gallium nitride film 200 is formed on the non-alignment layer 500 using sputtering. In the following description, when the configuration of the laminated structure 40 is the same as the configuration of the laminated structure 10, the laminated structure 20, and the laminated structure 30, the description of the configuration of the laminated structure 40 may be omitted.

The non-alignment layer 500 can reduce the crystallinity of the gallium nitride film 200. That is, the gallium nitride film 200 formed on the non-alignment layer 500 has low crystallinity. For example, an amorphous material such as silicon oxide can be used for the non-alignment layer 500. When the surface to be deposited of the gallium nitride film 200 has amorphous, the crystal growth of the gallium nitride film 200 can be inhibited.

The non-alignment layer 500 is patterned in a predetermined pattern. The patterning of the non-alignment layer 500 can be performed, for example, using photolithography. As shown in FIG. 8, the non-alignment layer 500 is patterned such that a portion of the alignment layer 300 is exposed. Therefore, the gallium nitride film 200 includes a region E in contact with the alignment layer 300 and a region F in contact with the non-alignment layer 500. The crystal growth of the gallium nitride film 200 is promoted in the region E, and the crystal growth of the gallium nitride film 200 is inhibited in the region F. That is, the gallium nitride film 200 of the laminated structure 40 includes the region E with high crystallinity and the region F with low crystallinity. Therefore, in the laminated structure 40, by providing the non-alignment layer 500 and patterning the non-alignment layer 500, the gallium nitride film 200 including regions with different crystallinity can be formed.

<Modification 5>

Figure 9:
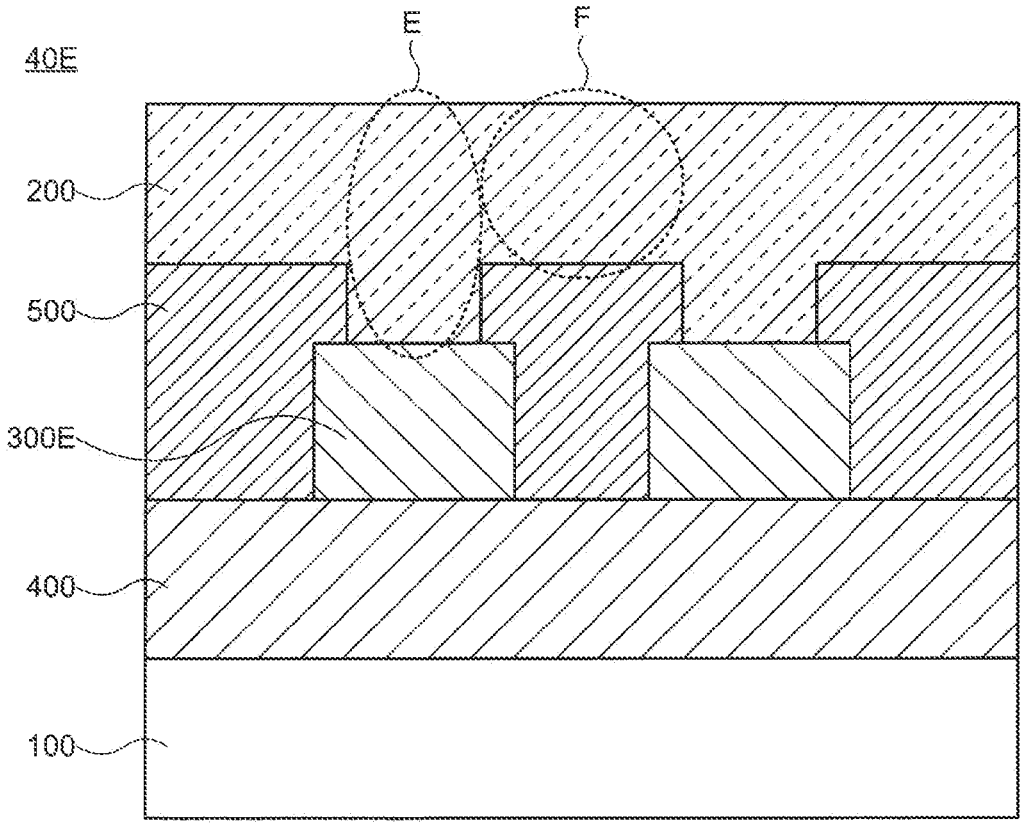
FIG. 9 is a schematic diagram showing a configuration of a laminated structure according to one embodiment of the present invention.

FIG. 9 is a schematic diagram showing a configuration of a laminated structure according to an embodiment of the present invention. The laminated structure 40E includes the substrate 100, the protective layer 400, an alignment layer 300E, the non-alignment layer 500, and the gallium nitride film 200. The alignment layer 300E is provided on the protective layer 400. The non-alignment layer 500 is provided on the alignment layer 300E. Further, the gallium nitride film 200 is formed on the non-alignment layer 500 using sputtering.

In the laminated structure 40E, not only the non-alignment layer 500 but also the alignment layer 300E are patterned in a predetermined pattern. The patterning of the alignment layer 300E can be performed, for example, using photolithography. As shown in FIG. 9, the alignment layer 300E is patterned such that a portion of the protective layer 400 is exposed. The exposed portion of the protective layer 400 is covered with a non-alignment layer 500. In the laminated structure 40E as well, the gallium nitride film 200 includes the region E in contact with the alignment layer 300 and the region F in contact with the non-alignment layer 500. In other words, the gallium nitride film 200 of the laminated structure 40E also includes the region E with high crystallinity and the region F with low crystallinity. Therefore, the gallium nitride film 200 including regions with different crystallinity can be formed also in the laminated structure 40E.

<Modification 6>

Figure 10:
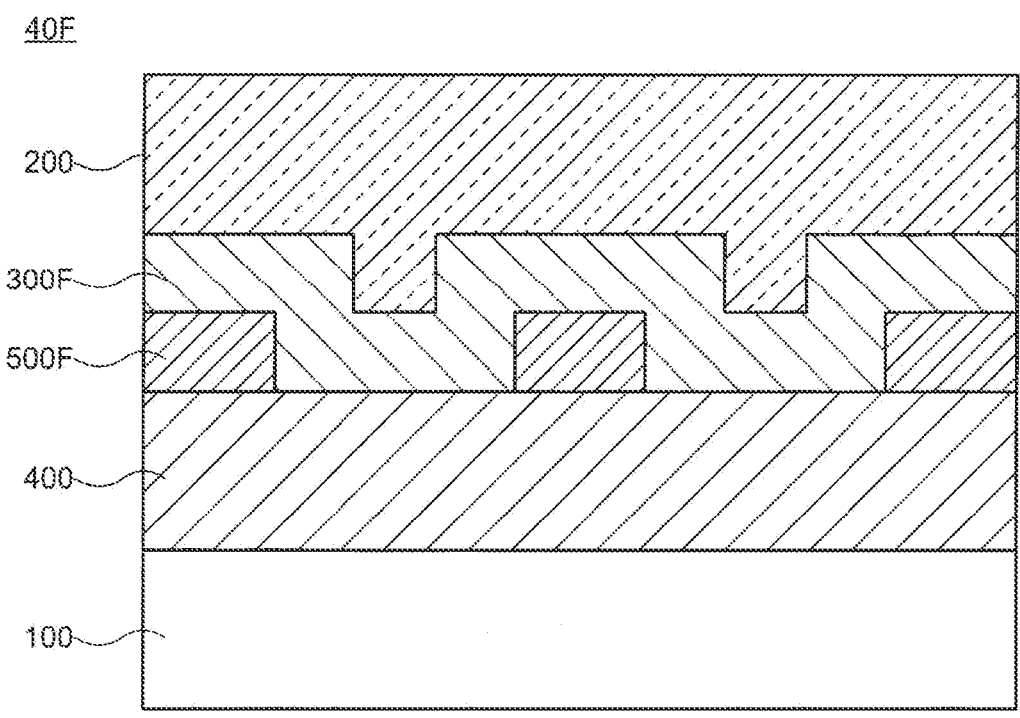
FIG. 10 is a schematic diagram showing a configuration of a laminated structure according to an embodiment of the present invention.

FIG. 10 is a schematic diagram showing a laminated structure 40F according to an embodiment of the present invention. The laminated structure 40F includes the substrate 100, the protective layer 400, a non-alignment layer 500F, an alignment layer 300F, and a gallium nitride film 200. The non-alignment layer 500F is provided on the protective layer 400. The alignment layer 300F is provided on the non-alignment layer 500F. Further, the gallium nitride film 200 is formed on the alignment layer 300F using sputtering.

In the laminated structure 40F, the non-alignment layer 500F having a predetermined pattern is covered with the alignment layer 300F. That is, the alignment layer 300F includes a region formed on the non-alignment layer 500F and a region formed on the protective layer 400. Since each region has a different degree of crystal growth, the alignment layer 300F includes regions with different c-axis orientations or different surface roughness. Further, the gallium nitride film 200 formed on such an alignment layer 300F also includes regions with different crystallinity corresponding to the respective regions of the alignment layer 300F. Therefore, in the laminated structure 40F, the gallium nitride film 200 including regions with different crystallinity can be formed by forming the alignment layer 300F so as to cover the patterned non-alignment layer 500F.

When the laminated structure 40F can be used for a backplane, it is possible to provide the backplane in which the crystallinity of the gallium nitride film 200 is controlled. Further, by using the uneven patterns of the non-alignment layer 500F and the alignment layer 300F as shown in FIG. 10, it is possible to control the light from the light emitting element and improve the light extraction efficiency.

Fifth Embodiment

Figure 11:
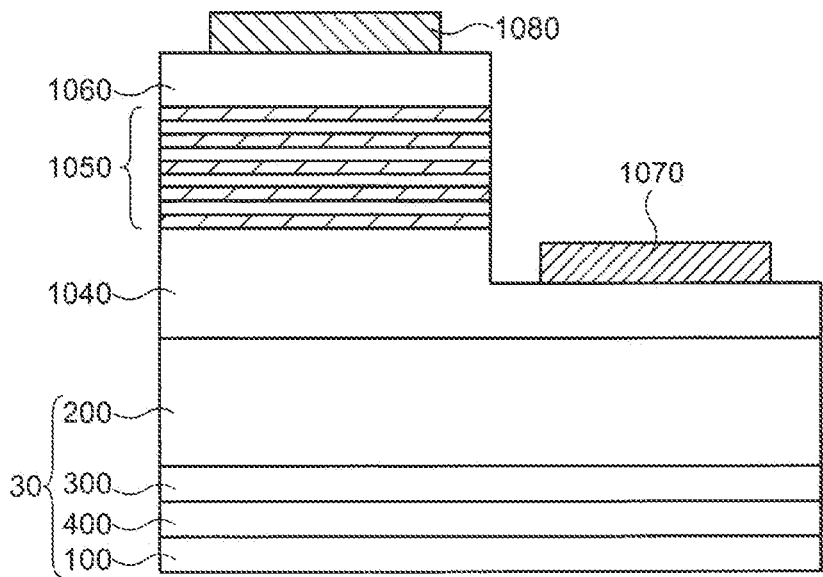
FIG. 11 is a schematic diagram showing a configuration of a light emitting device using a laminated structure according to an embodiment of the present invention.

FIG. 11 is a schematic diagram showing a configuration of a light emitting device 1000 using the laminated structure 30 according to an embodiment of the present invention.

As shown in FIG. 11, the light emitting device 1000 includes the laminated structure 30, an n-type semiconductor layer 1040, a light emitting layer 1050, a p-type semiconductor layer 1060, an n-type electrode 1070, and a p-type electrode 1080. Although the light emitting element 1000 is a so-called light emitting diode (LED), the light emitting element 1000 is not limited to the LED.

A silicon-doped gallium nitride film or the like can be used as the n-type semiconductor layer 1040. A laminated structure in which an indium gallium nitride film and a gallium nitride film are alternately laminated can be used for the light emitting layer 1050. A magnesium-doped gallium nitride film or the like can be used as the p-type semiconductor layer 1060. A metal such as indium can be used for the n-type electrode 1070. A metal such as palladium or gold can be used for the p-type electrode 1080.

The method for manufacturing the light emitting element 1000 is as follows. A silicon-doped gallium nitride film is formed on laminated structure 30. Further, an indium gallium nitride film and a gallium nitride film are alternately formed on the silicon-doped gallium nitride film to form a laminated structure. Furthermore, a magnesium-doped gallium nitride film is formed on the laminated structure. Then, the magnesium-doped gallium film, the laminated structure, and the silicon-doped gallium nitride film are etched using photolithography to form the p-type semiconductor layer 1060, the light emitting layer 1050, and the n-type semiconductor layer 1040. At this time, the etching is performed so as to expose a part of the surface of the silicon-doped gallium nitride film. The n-type electrode 1070 and the p-type electrode 1080 are formed on the n-type semiconductor layer 1040 and the p-type semiconductor layer 1060, respectively.

The silicon-doped gallium nitride film, the indium gallium nitride film, and the magnesium-doped gallium nitride film can be deposited using sputtering. Further, the silicon-doped gallium nitride film, the indium gallium nitride film, and the magnesium-doped gallium nitride film can be continuously deposited without breaking the vacuum using a plurality of vacuum chambers connected to each other through substrate transfer units.

As described above in this embodiment, the light emitting device 1000 can be manufactured using the laminated structure 30. Since the laminated structure 30 includes the substrate 100 that can have a large area, and the light emitting element 1000 is manufactured using a large-area substrate, the manufacturing cost of the light emitting element 1000 can be suppressed.

Sixth Embodiment

Figure 12:
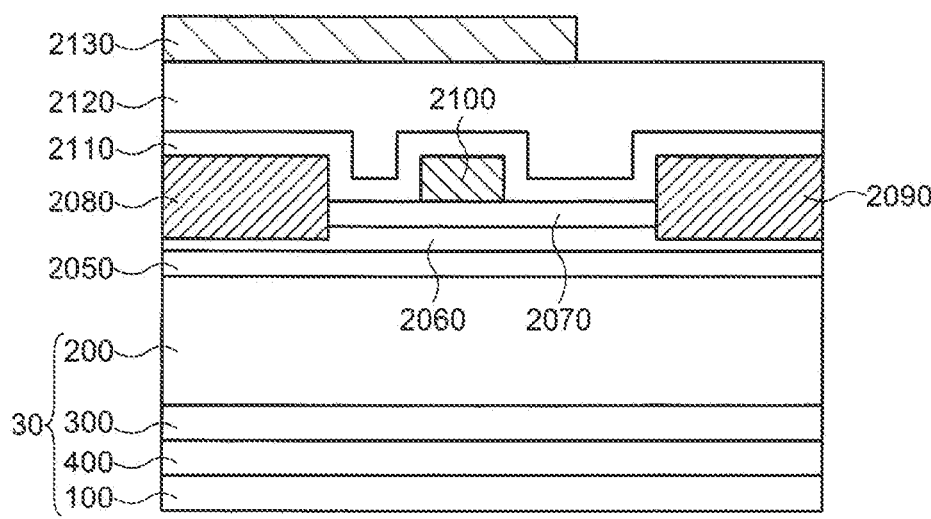
FIG. 12 is a schematic diagram showing a configuration of a semiconductor device using a laminated structure according to an embodiment of the present invention.

FIG. 12 is a schematic diagram showing a configuration of a semiconductor device 2000 using the laminated structure 30 according to an embodiment of the present invention.

As shown in FIG. 12, the semiconductor element 2000 includes the laminated structure 30, a first aluminum gallium nitride layer 2050, a second aluminum gallium nitride layer 2060, a third aluminum gallium nitride layer 2070, a source electrode 2080, a drain electrode 2090, a gate electrode 2100, a first insulating layer 2110, a second insulating layer 2120, and a shield electrode 2130. Although the semiconductor element 2000 is a so-called high electron mobility transistor (HEMT), the semiconductor element is not limited to the HEMT.

An aluminum gallium nitride film can be used as the first aluminum gallium nitride layer 2050. For example, a silicon-doped gallium nitride film can be used as the second aluminum gallium nitride layer 2060. An aluminum gallium nitride film can be used as the third aluminum gallium nitride layer 2070. For example, a metal such as titanium or aluminum can be used for the source electrode 2080 and the drain electrode 2090. For example, a metal such as nickel or gold can be used for the gate electrode 2100. For example, a silicon nitride film can be used as the first insulating layer

2110. For example, a silicon oxide film can be used as the second insulating layer 2120. For example, a laminated metal such as aluminum/titanium (Al/Ti) can be used as the shield electrode 2130.

The method for manufacturing the semiconductor element 2000 is as follows. The first aluminum gallium nitride layer 2050 is formed on the laminated structure 30. Further, a silicon-doped aluminum gallium nitride film and an aluminum gallium nitride film are deposited on the first aluminum gallium nitride layer 2050. The aluminum gallium nitride film and the silicon-doped aluminum gallium nitride film are then etched using photolithography to form the third aluminum gallium nitride layer 2070 and the second aluminum gallium nitride layer 2060. At this time, etching is performed so as to partially expose the surface of the silicon-doped aluminum gallium nitride film. The source electrode 2080 and the drain electrode 2090 are formed on the second aluminum gallium nitride layer 2060. Further, the gate electrode 2100 is formed on the third aluminum gallium nitride layer 2070. A silicon nitride film and a silicon oxide film are sequentially deposited to cover the source electrode 2080, the drain electrode 2090, and the gate electrode 2100 to form the first insulating layer 2110 and the second insulating layer 2120. The shield electrode 2130 is formed on the second insulating layer 2120.

The aluminum gallium nitride film and the silicon-doped aluminum gallium nitride film can be deposited using sputtering.

As described above in this embodiment, the semiconductor element 2000 can be manufactured using the laminated structure 30. Since the laminated structure 30 includes the substrate 100 that can have a large area, a large-area backplane in which the semiconductor elements 2000 are integrated can be manufactured.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A laminated structure comprising:
a substrate;
an alignment layer having a c-axis orientation or a (111) orientation of a face-centered cubic structure, over the substrate; and
a gallium nitride film on the alignment film,
wherein a surface arithmetic mean roughness (Ra) of a surface of the substrate is less than 0.33 nm.

2. The laminated structure according to claim 1, wherein the alignment layer is patterned in a predetermined pattern.

3. The laminated structure according to claim 1, further comprising a non-alignment layer patterned in a predetermined pattern between the substrate and the gallium nitride film.

4. The laminated structure according to claim 3, wherein the non-alignment layer is provided on the alignment layer.

5. The laminated structure according to claim 3, wherein the non-alignment layer is provided under the alignment layer.

6. The laminated structure according to claim 1, wherein the alignment layer comprises titanium, titanium nitride, titanium oxide, graphene, zinc oxide, magnesium diboride, aluminum, aluminum nitride, aluminum oxide, silver, calcium, nickel, copper, strontium, rhodium, palladium, cerium, ytterbium, iridium, platinum, gold, lead, actinium, thorium, lithium niobate, BiLaTiO, SrFeO, BiFeO, BaFeO, PMnN-PZT, or biological apatite.

7. The laminated structure according to claim 1, wherein the alignment layer comprises a first alignment layer and a second alignment layer.

8. The laminated structure according to claim 7, wherein at least one of the first alignment layer and the second alignment layer is patterned in a predetermined pattern.

9. The laminated structure according to claim 7, wherein each of the first alignment layer and the second alignment layer is a conductor.

10. The laminated structure according to claim 7, wherein the first alignment layer is a conductor, and the second alignment layer is an insulator.

11. The laminated structure according to claim 10, wherein the gallium nitride film is in contact with the first alignment layer.

12. The laminated structure according to claim 10, wherein the gallium nitride film is in contact with the second alignment layer.

13. The laminated structure according to claim 1, wherein a root mean square roughness (Rq) of a surface of the substrate is less than 0.39 nm.

14. The laminated structure according to claim 1, wherein the substrate is an amorphous glass substrate.

15. The laminated structure according to claim 1, wherein the substrate is a resin substrate.

16. The laminated structure according to claim 1, wherein the substrate is a polycrystalline substrate.

17. A laminated structure comprising:

a substrate;

a protective layer on the substrate;

an alignment layer having a c-axis orientation or a (111) orientation of a face-centered cubic structure, over the protective layer; and a gallium nitride film on the alignment film, wherein a surface arithmetic mean roughness (Ra) of a surface of the substrate is less than 0.33 nm.

18. The laminated structure according to claim 17, wherein a surface arithmetic mean roughness (Ra) of a surface of the protective layer is less than 0.51 nm.

19. The laminated structure according to claim 18, wherein the protective layer comprises silicon nitride or silicon oxide.

\* \* \* \* \*